US007470901B2

(12) United States Patent
Page et al.

(10) Patent No.: US 7,470,901 B2
(45) Date of Patent: Dec. 30, 2008

(54) CHARGED PARTICLE SPECTROMETER AND DETECTOR THEREFOR

(75) Inventors: Simon Charles Page, Derbyshire (GB); Colin Duncan Park, Greater Manchester (GB); Christopher Michael Hopper, Greater Manchester (GB)

(73) Assignee: Kratos Analytical Limited, Manchester (GB)

( * ) Notice: Subject to any disclaimer, the term of this patent is extended or adjusted under 35 U.S.C. 154(b) by 272 days.

(21) Appl. No.: 10/533,570

(22) PCT Filed: Nov. 4, 2003

(86) PCT No.: PCT/GB03/04750

§ 371 (c)(1),
(2), (4) Date: Jun. 27, 2005

(87) PCT Pub. No.: WO2004/042775

PCT Pub. Date: May 21, 2004

(65) Prior Publication Data

US 2006/0060770 A1 Mar. 23, 2006

(30) Foreign Application Priority Data

Nov. 5, 2002 (GB) ................................ 0225791.3

(51) Int. Cl.
*H01J 47/00* (2006.01)
*H01J 49/00* (2006.01)
*H01J 37/02* (2006.01)
*H01J 37/285* (2006.01)

(52) U.S. Cl. ....................... 250/305; 250/261; 250/306; 250/307; 250/282; 250/396 R; 250/397

(58) Field of Classification Search ......... 250/305–307, 250/251, 288, 302, 310, 336.1, 339.01, 339.02, 250/339.05, 339.06, 339.07, 341.1, 370.09, 250/370.1, 393–395, 580–588, 281, 282; 378/87, 88
See application file for complete search history.

(56) References Cited

U.S. PATENT DOCUMENTS 3,937,957 A * 2/1976 Schillalies et al. .......... 250/305

(Continued)

FOREIGN PATENT DOCUMENTS

EP 0 246 841 A2 11/1987

(Continued)

OTHER PUBLICATIONS

Hatfield et al, "An integrated multichannel charged-particle sensing system", Sensors and Actuators, vol. 54, No. 1-3, Jun. 1, 1996, pp. 777-781, XP004077965.

(Continued)

*Primary Examiner*—Bernard E Souw
(74) *Attorney, Agent, or Firm*—Squire, Sanders & Dempsey, LLP

(57) ABSTRACT

A charged particle (e.g. photoelectron) spectrometer is operable in a first mode to produce an energy spectrum relating to the composition of a sample being analysed, and in a second mode to produce a charged particle image of the surface of the sample being analysed. A detector is used to detect charged particles produced in both modes of operation. A method of operation of the spectrometer includes the step of selecting which of said first and second modes to use and the detector being operated accordingly.

15 Claims, 7 Drawing Sheets

U.S. PATENT DOCUMENTS

| | | | | | |
|---|---|---|---|---|---|
| 4,255,656 | A * | 3/1981 | Barrie et al. | 250/305 |
| 4,431,921 | A * | 2/1984 | Filthuth | 250/374 |
| 4,752,685 | A * | 6/1988 | Shiokawa et al. | 250/305 |
| 4,758,723 | A * | 7/1988 | Wardell et al. | 250/305 |
| 4,810,883 | A * | 3/1989 | Turner | 250/305 |
| RE33,275 | E * | 7/1990 | Wardell et al. | 250/305 |
| 4,965,861 | A * | 10/1990 | Filthuth | 250/385.1 |
| 5,032,724 | A * | 7/1991 | Gerlach et al. | 250/305 |
| 5,265,327 | A * | 11/1993 | Faris et al. | 29/825 |
| 5,286,974 | A * | 2/1994 | Walker et al. | 250/305 |
| 5,315,113 | A * | 5/1994 | Larson et al. | 250/305 |
| 5,444,242 | A * | 8/1995 | Larson et al. | 250/305 |
| 5,451,783 | A * | 9/1995 | Coxon et al. | 250/305 |
| 5,465,284 | A * | 11/1995 | Karellas | 378/62 |
| 5,506,414 | A * | 4/1996 | Coxon | 250/305 |
| 5,566,139 | A * | 10/1996 | Abshire | 368/118 |
| 5,569,916 | A * | 10/1996 | Tomie | 250/287 |
| 5,644,128 | A * | 7/1997 | Wollnik et al. | 250/251 |
| 5,665,967 | A * | 9/1997 | Coxon et al. | 250/287 |
| 6,104,029 | A * | 8/2000 | Coxon et al. | 250/305 |
| 6,326,617 | B1 * | 12/2001 | Tomie et al. | 250/305 |
| 6,583,420 | B1 * | 6/2003 | Nelson et al. | 250/397 |
| 6,589,779 | B1 * | 7/2003 | McDevitt et al. | 435/288.7 |
| 6,661,013 | B2 * | 12/2003 | Jagutzki et al. | 250/385.1 |
| 6,693,291 | B2 * | 2/2004 | Nelson et al. | 250/505.1 |
| 6,765,609 | B1 * | 7/2004 | Kinoshita | 348/222.1 |
| 6,800,852 | B2 * | 10/2004 | Larson et al. | 250/305 |
| 6,891,158 | B2 * | 5/2005 | Larson et al. | 250/305 |
| 6,949,741 | B2 * | 9/2005 | Cody et al. | 250/288 |
| 7,019,307 | B1 * | 3/2006 | Gribb et al. | 250/390.12 |
| 7,030,375 | B1 * | 4/2006 | Testoni et al. | 250/305 |
| 7,205,542 | B1 * | 4/2007 | Mankos et al. | 250/310 |
| 7,285,776 | B2 * | 10/2007 | Nakamura et al. | 250/305 |
| 2003/0080291 | A1 * | 5/2003 | Larson et al. | 250/306 |
| 2003/0080292 | A1 * | 5/2003 | Watson et al. | 250/306 |
| 2003/0205675 | A1 * | 11/2003 | Nelson et al. | 250/370.09 |
| 2003/0205676 | A1 * | 11/2003 | Nelson et al. | 250/370.09 |
| 2004/0021083 | A1 * | 2/2004 | Nelson et al. | 250/370.09 |
| 2004/0125913 | A1 * | 7/2004 | Larson et al. | 378/50 |
| 2004/0135081 | A1 * | 7/2004 | Larson et al. | 250/305 |
| 2004/0238735 | A1 * | 12/2004 | Larson et al. | 250/281 |
| 2004/0251419 | A1 * | 12/2004 | Nelson et al. | 250/370.09 |
| 2006/0060770 | A1 * | 3/2006 | Page et al. | 250/284 |
| 2006/0169893 | A1 * | 8/2006 | Lee et al. | 250/305 |
| 2007/0010973 | A1 * | 1/2007 | deCecco et al. | 702/189 |
| 2007/0115468 | A1 * | 5/2007 | Barnard | 356/300 |

FOREIGN PATENT DOCUMENTS

| | | | |
|---|---|---|---|
| EP | 1 170 778 | A | 1/2002 |
| GB | 2 359 187 | A | 8/2001 |

OTHER PUBLICATIONS

High Performance Imaging XPS—The Spherical Mirror Analyser available at http:/www.kratos.com/Agen/SMA.html, last updated Oct. 4, 1998.

* cited by examiner

CHARGED PARTICLE SPECTROMETER AND DETECTOR THEREFOR

The present invention relates to a charged particle spectrometer and to a method of operation of such a spectrometer. In particular, the present invention relates to a detector for such a spectrometer.

The bulk of the specification describes the application of the invention in a photoelectron spectrometer, but other charged particle instruments would also be suitable. For example, a hemispherical-only analyser system where the input lens system is operated in such a way as to project a line image from the specimen that is then dispersed in the orthogonal direction to generate a 2d image, with one axis being positioned along a line on the sample and the other showing photoelectron energy. Alternatively, the input lens system could be operated to project an angular distribution from the sample as in for example a Thermo VG Scientific Theta Probe.

Also, for example, the invention could be applied to spectrometers using Auger electrons or scattered ions as the analysed charged particles.

A current photoelectron spectrometer produced by the applicant is shown schematically in FIG. 1. The instrument consists of a magnetic lens 2 above which is located the sample 4 to be analysed. In use, the sample 4 is bombarded by X-rays from an X-ray source 6 and the photoelectrons produced are passed through a charge neutraliser 8 and an electrostatic lens system 10 so as to be focused at an entry 12 to an energy analysing section 14.

The instrument has two modes of operation: a spectrum mode for analysing the composition of the surface of the sample 4; and an imaging mode for producing a magnified energy selected photoelectron image of the surface of the sample 4. In the spectrum mode, the photoelectrons pass around a hemispherical analyser 16 and are received by a pair of detectors 18, 20, which are typically each a set of channeltrons. The two sets of channeltrons enable the instrument to produce an energy spectrum relating to the composition of the surface of the sample 4 from which that composition can be analysed.

In imaging mode, the photoelectrons pass through spherical mirror analyser portion 22 of the energy analysing section 14 and are received by a different detector 24 which is typically a micro channel plate (MCP) detector. Photoelectrons received by the micro channel plate are used to produce further secondary electrons which are then projected on to a phosphorescent screen. The phosphorescent screen can then be viewed by a CCD camera from which an energy analysed photoelectron image of the surface of the sample 4 can be produced. Said image could represent the distribution of a particular element or chemical state of the element.

This instrument has the disadvantage that two types of detectors are required as explained above, one for each mode of operation. The present invention aims to reduce or overcome some or all of the disadvantages associated with prior art instruments.

Accordingly, in a first aspect, the present invention provides a charged particle spectrometer which is operable in a first mode to produce an energy spectrum relating to the composition of a sample being analysed, and in a second mode to produce a charged particle image of the surface of the sample being analysed, wherein the spectrometer includes a detector which is used to detect charged particles produced in both modes of operation.

The charged particles could be photoelectrons, auger electrons or other secondary electrons from the specimen or even ions if the spectrometer was to be used for ion scattering spectroscopy.

In this way, the present invention reduces the complexity of the detector system of the prior art instrument. Also the detector can receive charged particles, e.g. photoelectrons, over a larger physical area than is the case with the prior art since in the prior art the two types of detector can not be located in the same physical location and so each detector in use is only covering a part of the detection area.

Preferably the charged particle spectrometer is a photoelectron spectrometer, wherein the charged particle image is a photoelectron image, and wherein the charged particles are photoelectrons.

Preferably the detector includes plate means (such as a micro channel plate) on to which in use primary electrons are directed in both modes of operation and which emits a plurality of secondary electrons for each primary electron received. Preferably the detector also includes first delay line means for using the plurality of secondary electrons to produce a pair of electrical pulses in a delay line from which a signal processing means can calculate the location of the primary electron on the plate means in a first direction. More preferably, the detector also includes second delay line means for using the plurality of secondary electrons to produce a pair of electrical pulses in a second delay line from which the signal processing means can calculate the location of the primary electron on the plate means in a second direction.

Effectively, this type of detector partly replaces the phosphorescent screen and CCD detector as described in the prior art. This enables the location of each primary electron on the plate means to be determined more accurately.

Preferably the first and second directions are orthogonal e.g. effectively define an X and Y axis on the plate means.

In some embodiments the spectrometer includes second signal processing means (which it may be separate from, or part of the signal processing means mentioned above) for processing the signals received from one or both of the delay lines in order to reduce or eliminate any unwanted signals, such as noise caused by imperfections in the construction of the detector and/or electronic cross talk between the delay lines.

Preferably the spectrometer includes control means for controlling its operation and enabling a user to select which of the two modes is operating. Preferably the control means also controls the signal processing means such that when the spectrometer is operating in spectrum mode, the signal processing means utilises signals from only one of the delay line means.

Additionally or alternatively, the control means may also control the signal processing means so that when the spectrometer is operating in image mode the signal processing means utilises signals from both the first and second delay line means and may also include further processing means for increasing the accuracy of the time measurements of the electrical pulses, preferably by stretching the time between each one of a pair of pulses so that the time difference may be more accurately measured.

In a further aspect, the present invention provides a detector for a charged particle spectrometer, the detector including any or all of the features described above.

In a further aspect, the present invention provides a method of operating the charged particle spectrometer as described above wherein the method includes the step of selecting which of the two modes to use and the detector being operated accordingly.

An embodiment of the present invention will now be described with reference to the accompanying drawings in which.

Figure 1:
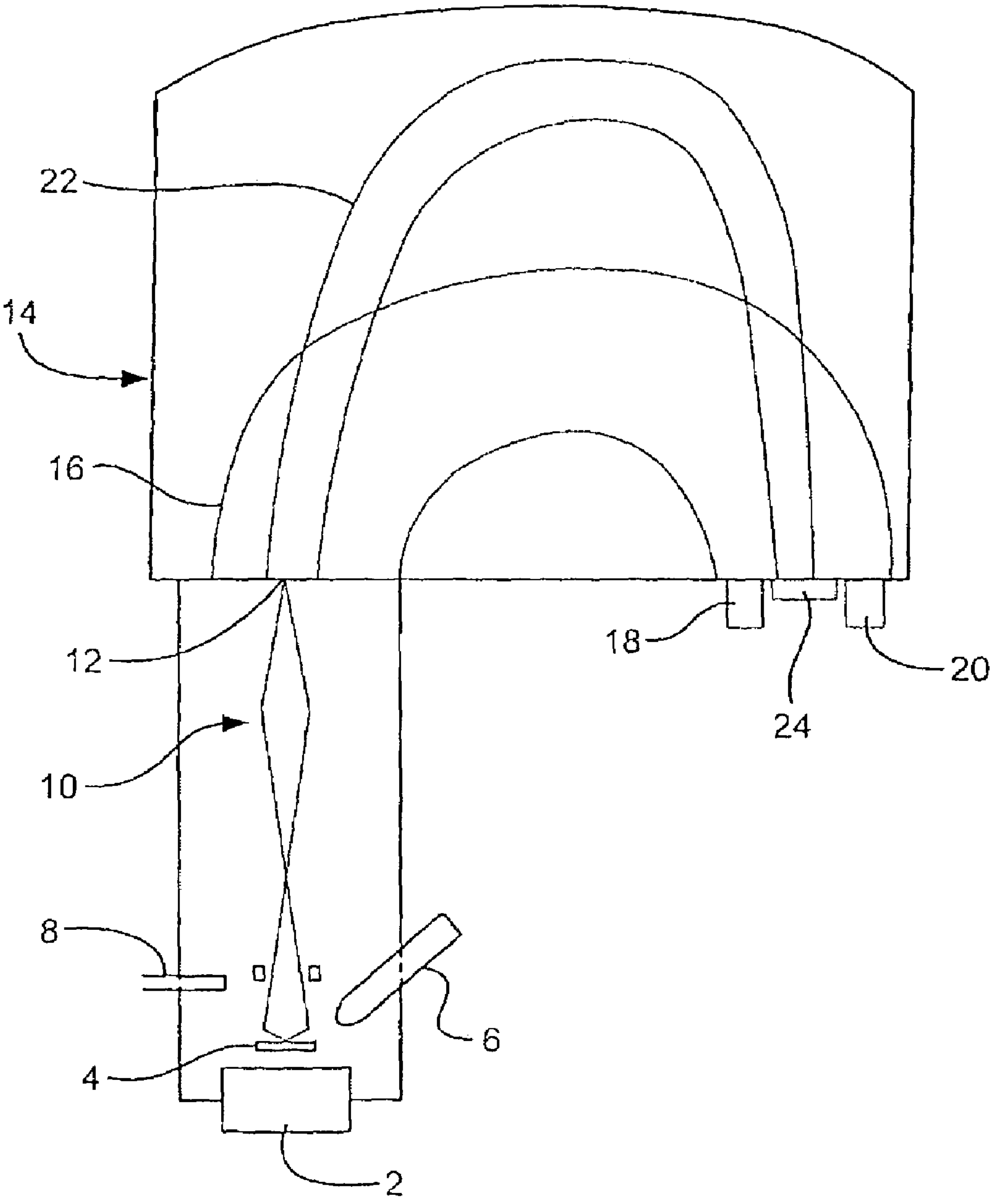
Fig.1 (Prior Art)
FIG. 1 is a schematic diagram of a prior art photoelectron spectrometer.
Figure 2:
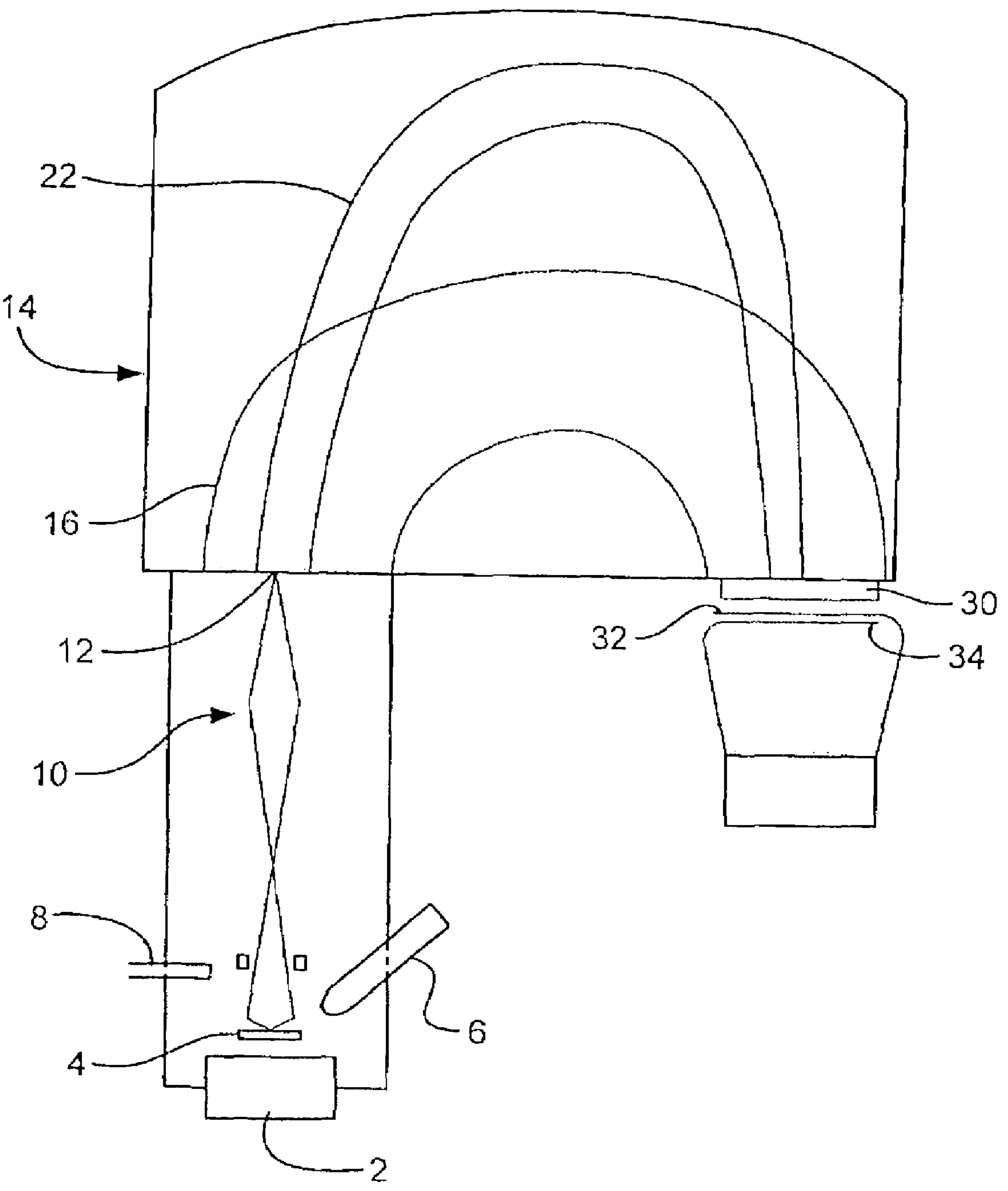
FIG. 2 is a schematic diagram of a photoelectron spectrometer according to the present invention.

FIG. 2 shows a schematic diagram of an XPS (X-ray photoelectron spectrometer) which in its basic operation is fairly similar to the instrument shown in FIG. 1. Identical reference numerals have been used for those parts of the instrument which are the same. The main differences lie in the detector used.

In FIG. 2, the spectrometer includes a single detector unit 30 which is usable in both modes of operation of the spectrometer—spectrum mode and imaging mode. In some embodiments, the detector plate 30 is a micro channel plate (MCP) and in some other embodiments it may include a plurality of micro channel plates, such as three or more plates.

Arranged adjacent to the detector plate 30 is a pair of delay lines 32, 34, although more or fewer delay lines may be used. The detector plate 30 and the delay lines 32, 34 together make up the detector of this instrument and this detector is usable for both imaging and spectroscopy, unlike the prior art instrument described above.

Figure 3:
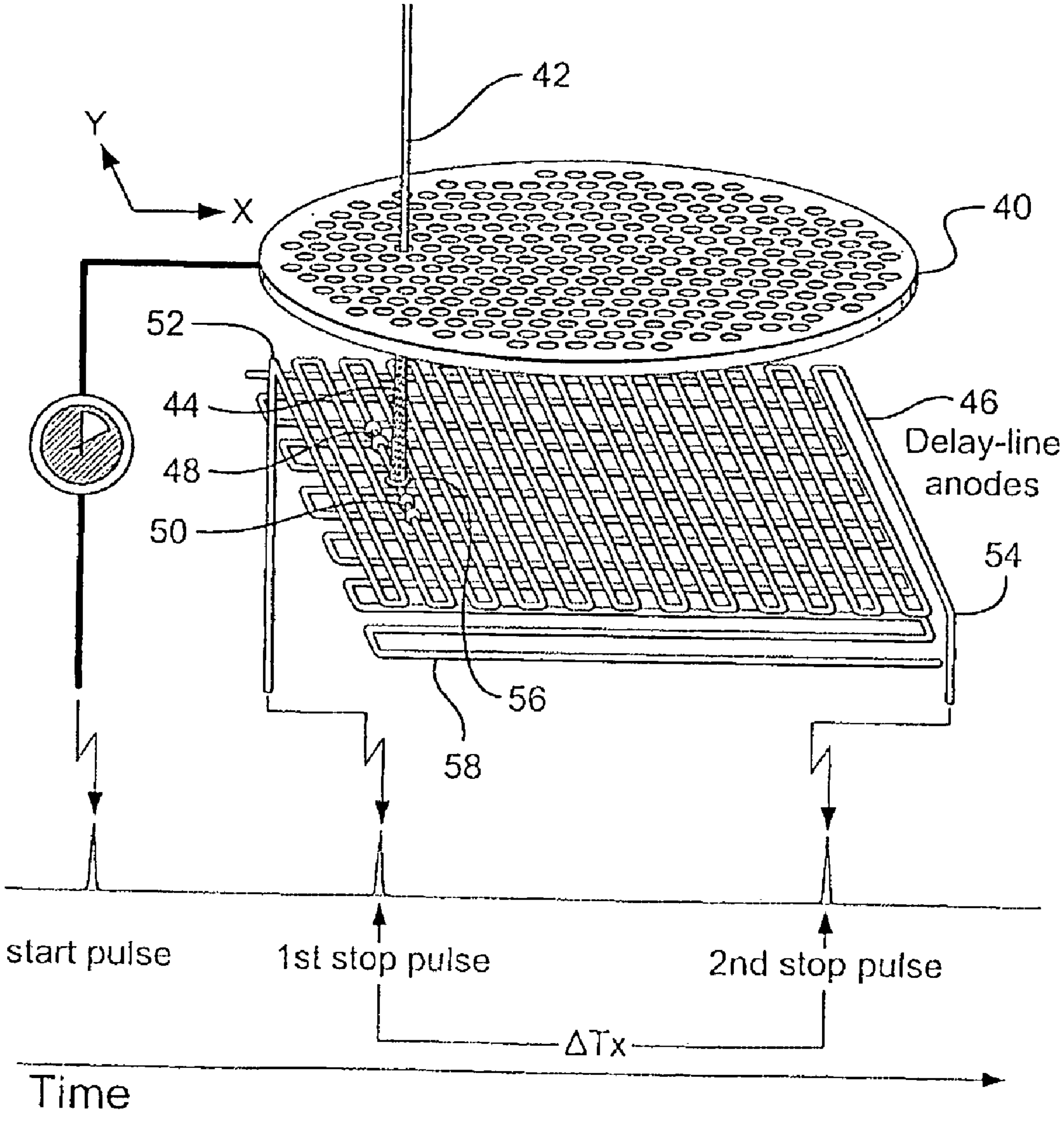
FIG. 3 is a schematic diagram showing part of a detector according to an embodiment of the present invention.

FIG. 3 shows in schematic form the operation of part of the detector. In use, in either mode of operation, primary electrons from the instrument will strike the micro channel plate (MCP) 40. In FIG. 3, a single electron 42 is schematically shown striking the micro channel plate 40. The operation of the detector plate, such as an MCP, is to amplify a single electron by a large factor (e.g. $10^7$) to produce a "shower" 44 of secondary electrons. A delay line 46 is arranged in a suitable position so that the shower 44 of electrons may fall on it or strike it. As shown in this embodiment, the delay line 46 is arranged such that it covers all or substantially all of the area of the detector plate and also preferably such that the line is laid out in a serpentine fashion whereby the elongate parts of the line are parallel or substantially parallel. However, other arrangements of the delay line are possible such as that produced by winding the delay line around a former to produce a helically wound delay line.

In this way, the elongate parts of the delay line 46 may be arranged to lie perpendicular to a chosen axis of the detector plate. In this example, the delay line 46 lies perpendicular to what is shown as the "X" axis and so the delay line is called the "X" delay line.

The function of the delay line 46 is such that the shower of secondary electrons striking it produces a pair of pulses 48, 50 which propagate tin respectively different directions along the delay line i.e. one pulse 50 propagates towards a first end 52 and the second pulse 48 propagates towards a second end 54. The ends of the delay line may be connected to signal processing means which receives the pulses 48, 50 and calculates the time difference between their times of receipt, shown schematically in FIG. 3. This time difference enables the point or origin 56 of the shower 44 on the delay line 46 to be calculated, or at least its coordinate in the "X" direction. This correlates to the position at which the primary electron 42 struck the detector plate and so the position of that electron in the "X" direction can be determined.

In some of the embodiments, the detector may include a second delay line which functions as described above but is laid out in a different way. Preferably the second delay line is laid out so that its elongate parts lie perpendicular to a different axis to the "X" axis and more preferably that different axis is orthogonal to the "X" axis e.g. the "Y" axis shown in FIG. 3. In this way, the position of the primary electron 42 may be determined with respect to both axes i.e. its precise location on the detector plate can be known if necessary depending on the mode of operation of the spectrometer. A second delay line 58 is shown in FIG. 3, which lies perpendicular to what is shown as the "Y" axis and so the second delay line is called the "Y" delay line.

Other arrangements of the delay lines are possible, so that the elongate parts of the delay line may be arranged to lie parallel to a chosen axis of the detector plate. For example the elongate parts of an "X" delay line may lie parallel to an "X" axis, and those of a "Y" delay line may lie parallel to a "Y" axis, wherein the "X" delay line enables the coordinate in the "X" direction of a shower of secondary electrons to be calculated, and wherein the "Y" delay line enables the coordinate of the shower in the "Y" direction to be calculated.

Figure 4:
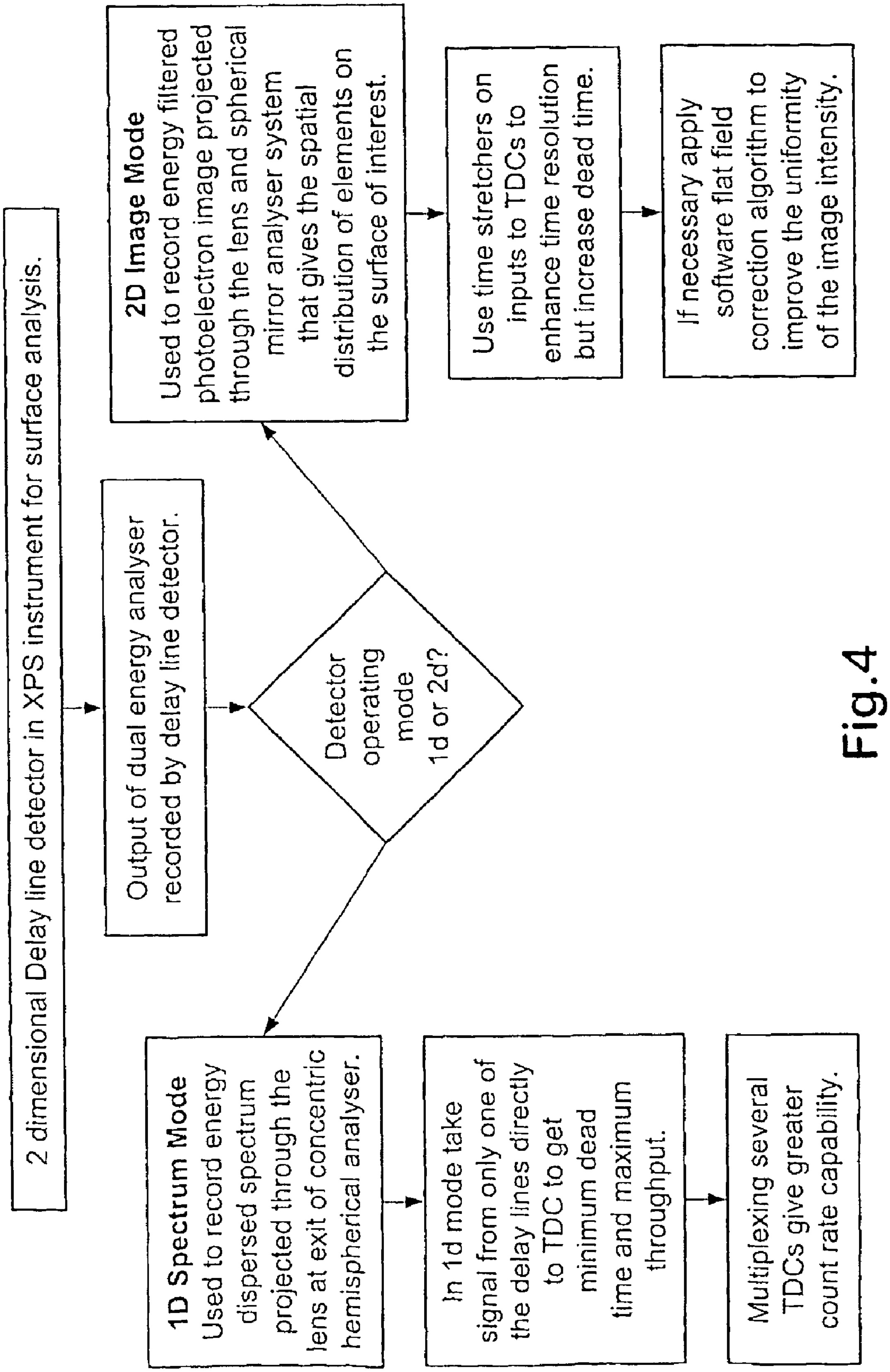
FIG. 4 is a flow chart showing the operation of a spectrometer according to an embodiment of the present invention.

The spectrometer of one aspect of the present invention may be operable in either one of two different modes as mentioned above—a spectrum mode and an imaging mode. FIG. 4 is a flow chart showing an overview of the operation in both modes. As can be seen, in spectrum mode only readings in only one dimension are required at the detector and so only a portion of the detector may be used. In the detector embodiment utilising a pair of delay lines as described above, this means that the signal processing means may operate on only signals received from one of the delay lines e.g. the "X" delay line 46 as shown in FIG. 3. This is also shown in more detail in FIG. 5.

FIG. 4 also shows the operation of the spectrometer in the imaging mode in which data from two dimensions on the detector is desired. In the detector embodiment described above utilising a pair of delay lines, this means that the outputs of both delay lines will be utilised by the signal processing means as previously described in order to determine the position of the primary electrons on the detector.

Figure 5:
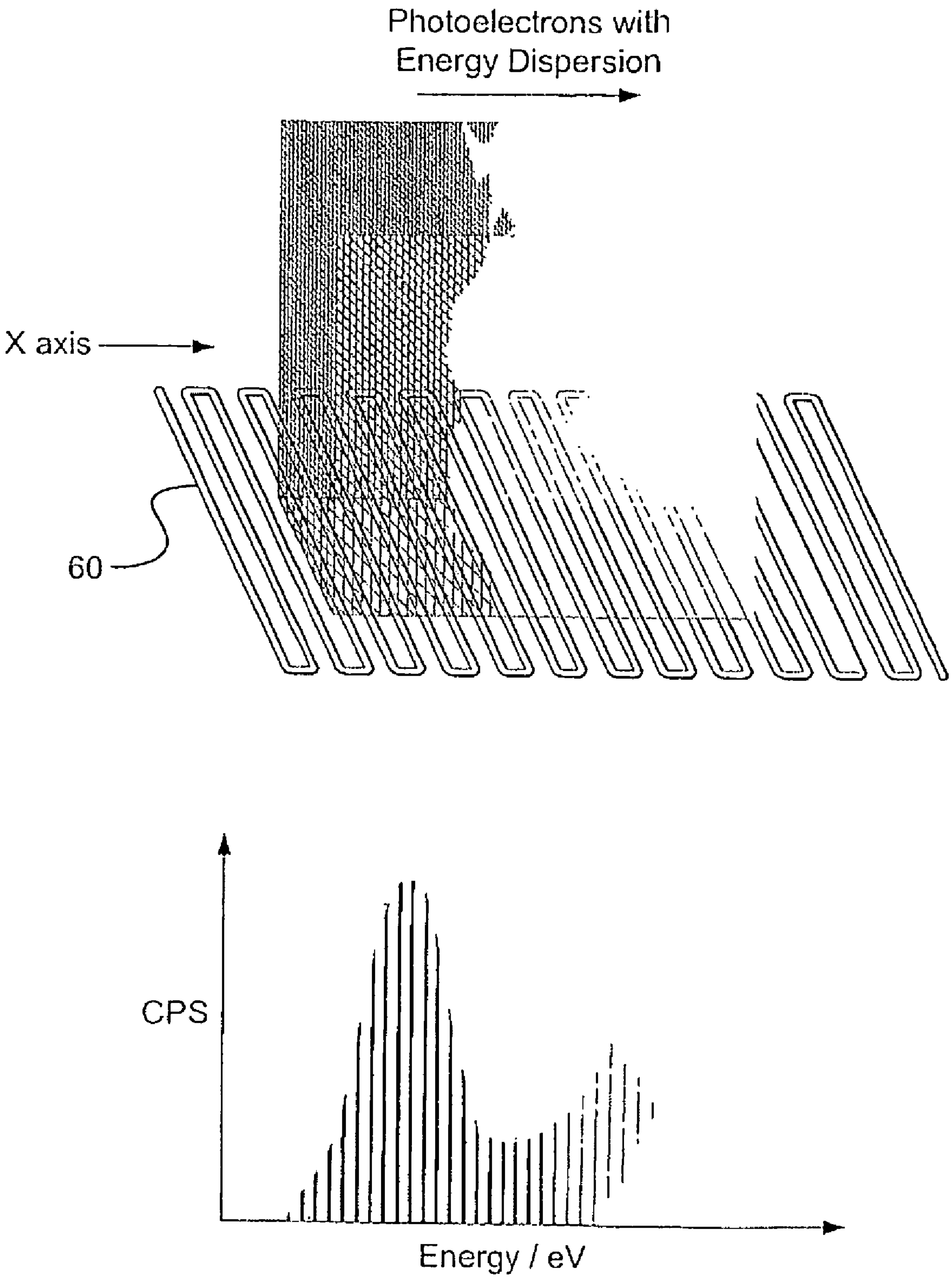
FIG. 5 is a schematic diagram showing the operation of a detector according to an embodiment of the present invention in spectroscopy or spectrum mode.

FIG. 5 shows schematically how a single delay line 60 is utilised to determine a measurement of the energy of photoelectrons falling on the detector plate. By the nature of the operation of the spectrometer, the further along the "X" axis at which an electron strikes the detector plate, the greater its energy. The delay line 60 is used as previously explained in order to determine the position of electron strike in this "X" direction. In this mode, one or more "time stretchers" may be used in order to enhance the time resolution available for calculating the time difference between pulses in a pair of pulses on each delay line.

In the 1 dimensional single delay line mode because the stretchers may not be needed since there may be no need to enhance the time resolution in this mode. In this mode it is usually more important to maximise the count rate and time stretchers reduce the maximum rate at which events can be processed because they extend the required acquisition time for each event. However in an application where enhanced resolution was required then it would be desirable to use time stretchers.

Figure 6:
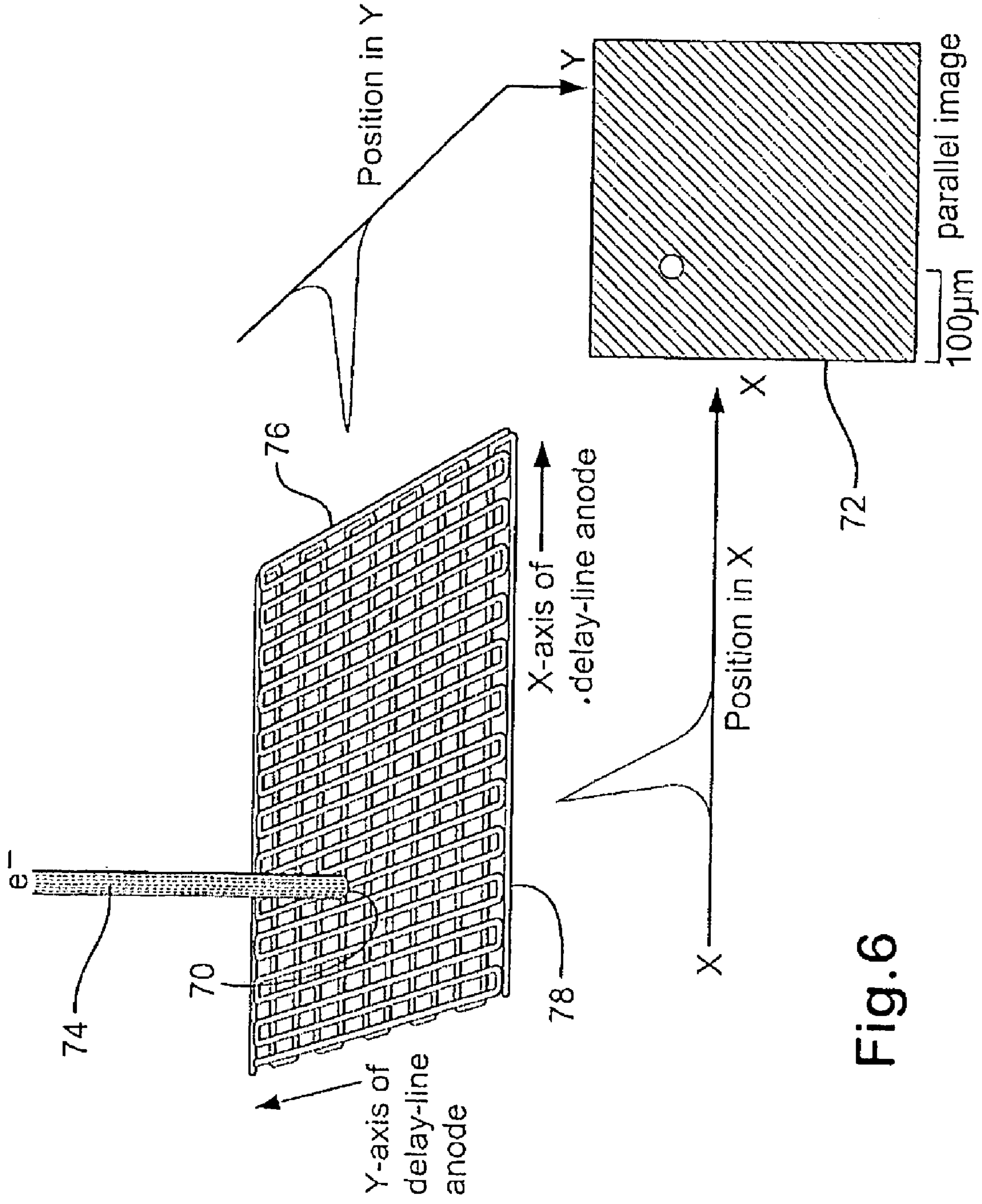
FIG. 6 is a schematic diagram showing part of a detector according to an embodiment of the present invention and its operation in imaging mode.

FIG. 6 shows in schematic form the operation of part of the detector in imaging mode. A "shower" 74 of secondary electrons is schematically shown striking the "X" delay line 76, and the "Y" delay line 78. As shown in FIG. 6, the elongate parts of the delay line 76 lie perpendicular to the "X" axis and the elongate parts of the delay line 78 lie perpendicular to the "Y" axis. The shower of secondary electrons 74 produces a pair of pulses in each of the delay lines, which propagate to different ends thereof. The ends of the delay lines may be connected to signal processing means which receives the pulses and calculates the point or origin 70 of the shower on the delay lines. The pulses in the "X" delay line 76 enable the signal processing means to determine the coordinate of the shower 74 on that delay line in the "X" direction, and the pulses in the "Y" delay line 78 enable the signal processing means to determine the coordinate of the shower on the "Y" delay line in the "Y" direction. In this way, a photoelectron image 72 may be produced, which may be a magnified photoelectron image of the surface of the sample in the spectrometer.

A detailed embodiment of the detector electronics will now be described in order to illustrate the operation of both modes:

The position of an electron impact on the detector is determined using an electronic system.

When an electron hits the front of the detector microchannel plate (MCP) it causes a current pulse from the MCP power supply, as an avalanche of secondary electrons is created. The current pulse may be detected as a voltage pulse across a resistor. Preferably, after amplification, if the pulse exceeds a predefined threshold, an ECL (emitter coupled logic) "start" pulse is generated e.g. using a constant fraction discriminator circuit (CFD). The CFD may be used rather than a simple threshold detector so that the timing of the ECL signal is related to the peak of the voltage pulse, and is independent of the amplitude of the pulse. Other types of logic interface may also be used.

The logic interface is a description of the type of signal processing electronic components. ECL is one type, other types are, for example, Low Voltage Differential Signalling (LVDS) or Low Voltage Positive ECL (LVPECL). The CFD function may be performed by any of the above "logic interface" standards.

The electron cloud leaving the back of the MCP hits the detector wire(s), and respective current pulses propagate to both ends of each detector wire. They are detected e.g. as voltage pulses across resistors, may be amplified and preferably ECL "stop" pulses are generated using CFDs as before. The position of the electron impact on the detector can be determined by timing between the start pulse and the stop pulses, using the position measurement electronics. The difference between the two times for each wire indicates the distance of the impact position from the centre of the wire. The sum of the two times for each wire should be constant, and can be used to detect and reject overlapping impacts.

The position measurement electronics uses e.g. multichannel time-to-digital converter (TDC) integrated circuits to measure the start to stop periods. The stop pulses are enabled into the circuitry by the arrival of a start pulse, to prevent spurious stop pulses causing invalid measurements. A timeout period may be used to reset the circuitry if the stop pulses are not received within the maximum start to stop duration. In this example, valid ECL signals are converted to positive ECL (PECL) and are passed to the TDC inputs. Typically, the TDCs are capable of timing start to stop periods to a 500 ps resolution.

As described before, the electronics has two modes of operation: a single dimensional mode and a two dimensional mode. In the single dimensional mode the stop pulses from only one of the detector windings are used. In this mode the typically 500 ps resolution of the TDC is sufficient, but a high TDC throughput is desired. This is achieved by multiplexing the start and stop pulses to each of a plurality e.g. four, TDCs in turn. While one device is timing an event, the other device (s) are at different stages of outputting their data to a storage device, e.g. FIFO ("first in first out"), under the control of a hardware state machine. The times are then read from the FIFO into a digital signal processor (DSP) for processing.

In the two dimensional mode the signals from both detector windings are used. In this mode an improved time resolution of typically 50 ps is achieved using a time stretching circuit. In one example, a capacitor is charged to a set voltage, prior to operation of the time stretcher circuit. During the start to stop period the capacitor is negatively charged using a fixed constant current, such that the capacitor voltage crosses a threshold just below the initial voltage and continues to increase negatively until the end of the start to stop period. At the end of this period the capacitor is charged positively at a slower rate using a lower constant current, back to the initial voltage. As the capacitor voltage crosses the threshold voltage, a high-speed comparator produces a stop signal, which is passed to the TDC. The amount the time is stretched is determined by the ratio of the discharging current to the charging current.

A lower throughput is required in two-dimensional mode, so the time stretching and the need to read four values out of the TDC rather than two, does not cause a throughput problem. It is also possible to use a single TDC in this mode to eliminate small timing offset differences, caused by manufacturing process differences between TDCs, which may otherwise be experienced.

It is possible that images captured using the delay line detector may contain distortions which appear as faint horizontal and vertical stripes. These are thought to be caused by imperfections in the construction of the detector and/or electronic cross talk between the four stop signals. The invention may use a calibration method which reduces these artefacts.

It is assumed that the stripes are caused by the detector system "moving" electron events slightly from their true positions, depending on their positions in the image and that the error in the horizontal (X) position is independent of the vertical (Y) position and vice versa. Where the image is too bright, the electron events are moved away from each other and where the image is not bright enough, the electron events are moved closer together. Each electron event's position can be corrected independently for X and Y. The calibration consists of two tables containing a position adjustment for each X and Y position.

This procedure causes a slight loss of spatial resolution, but because adjustments are small the loss of resolution is small compared with the instrument resolution. There is no effect on image intensity, since the overall number of electron events remains the same.

The calibration tables are generated using a reference image obtained by uniformly illuminating the detector with charged particles.

The procedure for generating the correction table for X positions of an image is described. The procedure for Y is identical. As an example, the image is assumed to be 500 points by 500. The reference image consists of a list of X and Y co-ordinates in the range 0-499. The total number of electron events should be as large as is practical, typically several million.

1. The total number of electron events at each X position (regardless of Y position) is calculated, giving a array of 500 intensities. Each element represents the total intensity of a vertical line of the image.

2. The list of intensities is normalised by dividing each intensity by the average of all intensities and subtracting 1.0. This gives a list of positive and negative values close to zero and represents the error in intensity at each position.
3. The calibration table of position adjustments is derived as follows.

The position adjustment for the first point (co-ordinate value 0) is set to half the intensity error for the first point.

For all other points except the last, starting with the 2nd point and working up, the position adjustment is set to the position adjustment of the previous point added to the average intensity error of the previous and current points.

For the last point (co-ordinate value 499), the position adjustment is set to the position adjustment of the previous point (co-ordinate value 498) added to half the intensity error of the last point.

The co-ordinates for each electron event are adjusted by adding the appropriate X position adjustment to the X co-ordinate and the appropriate Y position adjustment to the Y co-ordinate. This results in co-ordinates which are real numbers, not integers and some co-ordinates may be less than 0.0 or greater than 499.0.

Often, it is necessary to convert the co-ordinates to integers. Because the calibration corrections are typically less than 1.0, simply truncating or rounding the co-ordinates to integers would not give acceptable results. In order to convert the co-ordinates to integers an algorithm is used which rounds up or down at random, with the probability of rounding up depending on the magnitude of the fractional part. This is done by adding a random number between 0.0 and 0.9999999 to each co-ordinate and then truncating to an integer.

Figure 7:
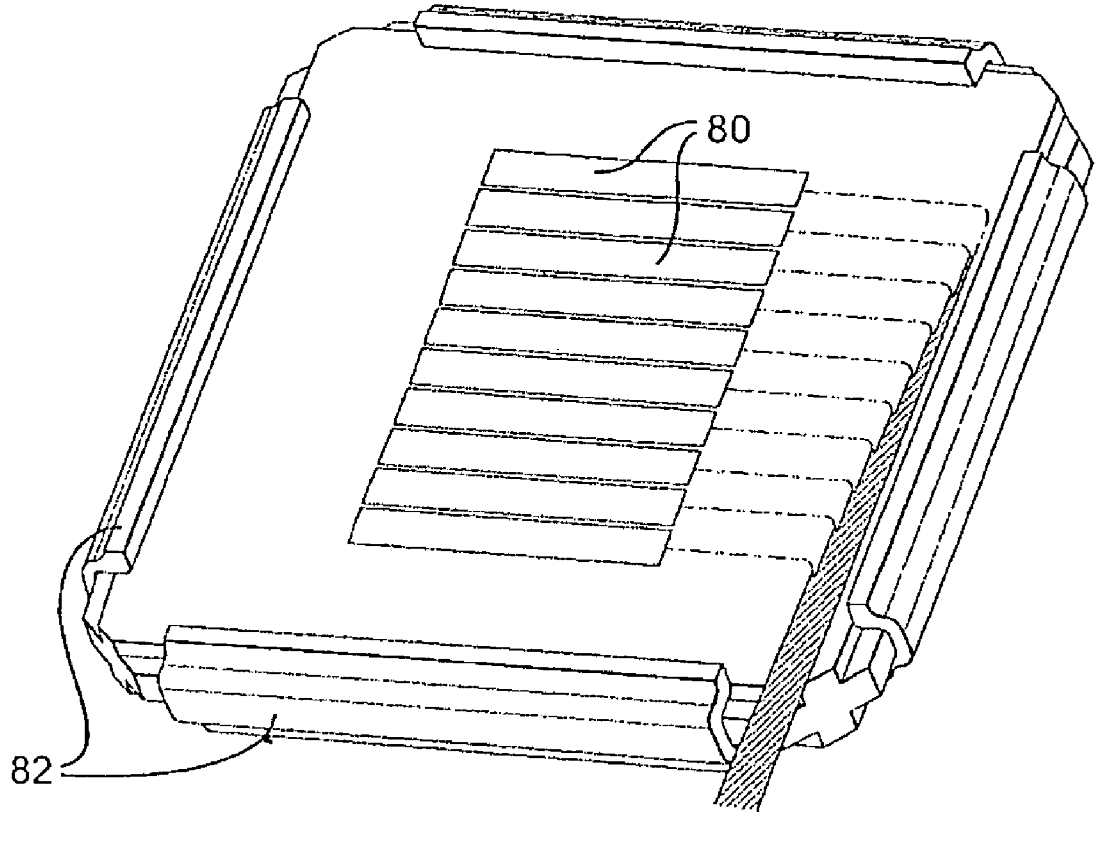
FIG. 7 is a schematic diagram showing a further delay line anode assembly.

FIG. 7 shows a diagram of a delay line anode assembly that includes some additional electrodes. These are flat rectangular collector plates (80) for the electron clouds emitted by the MCPs that can be used instead of (or as well as) one of the delay lines to detect the position of the electron events along one of the directions.

The plates (80) are mounted behind the delay line wires (not shown on this diagram—just the semicircular delay line guides (82) are shown) and the charge emitted by the MCP can be preferentially collected by their by changing the relative potentials on the delay line wires and the discrete anodes. A second array of plates could be added so that each delay line had a corresponding array of plates.

The plates (80) could each be connected to a separate amplifier discriminator counter channels. They have the advantage of being able to record a higher overall count rate from the detector for certain high count rate applications but at reduced positional resolution (the resolution is determined by the size of each plate). The delay line detector system, (timing the pulses at the ends of the line) may be limited to a few million events per second. Some signal sources for the spectrometer can produce signal levels of e.g. 10 times this so in this case this third mode of operation using separate discrete anodes may be appropriate.

The above embodiments are intended to be an example of the present invention and variants and modifications of those embodiments, such as would be readily apparent to the skilled person, are envisaged and may be made without departing from the scope of the present invention.

The invention claimed is:

1. A charged particle spectrometer which is operable in a first mode using a hemispherical analyser to produce an energy spectrum relating to the composition of a sample being analysed, and in a second mode using a spherical mirror analyser to produce a two-dimensional charged particle image of the surface of the sample being analysed, wherein the spectrometer includes a detector which is used to detect charged particles produced in both modes of operation.

2. A charged particle spectrometer according to claim 1 which is a photoelectron spectrometer, wherein the charged particle image is a photoelectron image, and wherein the charged particles are photoelectrons.

3. A charged particle spectrometer according to claim 1 wherein the detector includes a plate means, on to which, in use, primary electrons are directed in both modes of operation, and which emits a plurality of secondary electrons for each primary electron received.

4. A charged particle spectrometer according to claim 3 wherein the plate means is a micro channel plate.

5. A charged particle spectrometer according to claim 3 wherein the detector also includes a first delay line means for using the plurality of secondary electrons to produce a pair of electrical pulses in a first delay line from which a signal processing means can calculate the location of the primary electron on the plate means in a first direction.

6. A charged particle spectrometer according to claim 5 wherein the detector also includes a second delay line means for using the plurality of secondary electrons to produce a pair of electrical pulses in a second delay line from which the signal processing means can calculate the location of the primary electron on the plate means in a second direction.

7. A charged particle spectrometer according to claim 6 wherein the first and second directions are orthogonal.

8. A charged particle spectrometer according to claim 5 wherein second signal processing means processes the signals received from one or both of the delay lines to reduce or eliminate any unwanted signals.

9. A charged particle spectrometer according to claim 5 including a control means for controlling its operation and enabling a user to select which of the two modes is operating.

10. A charged particle spectrometer according to claim 9 wherein the control means also controls the signal processing means such that when the spectrometer is operating in said first mode, the signal processing means utilises signals from only one of the delay line means.

11. A charged particle spectrometer according to claim 9 wherein the control means also controls the signal processing means so that when the spectrometer is operating in said second mode the signal processing means utilises signals from both the first and second delay line means.

12. A charged particle spectrometer according to claim 9 wherein the control means includes further processing means for increasing the accuracy of time measurements of the electrical pulses.

13. A charged particle spectrometer according to claim 12 wherein the further processing means increases said accuracy by stretching the time between each one of a pair of pulses so that the time difference may be more accurately measured.

14. A method of operation of a charged particle spectrometer according to claim 1 wherein the method includes the step of selecting which of said first and second modes to use and the detector being operated accordingly.

15. A charged particle spectrometer, comprising:

a hemispherical analyser and a spherical mirror analyser, the spectrometer being operable in a first mode using the hemispherical analyser to produce an energy spectrum relating to the composition of a sample being analysed and in a second mode using the spherical mirror analyser to produce a charged particle image of the surface of the sample being analysed, wherein the spectrometer includes a detector which is used to detect charged particles produced in both modes of operation, and the detector includes (1) a plate means, on to which, in use, primary electrons are directed in both modes of operation and which emits a plurality of secondary electrons for each primary electron received; (2) a first delay line means for using the plurality of secondary electrons to produce a pair of electrical pulses in a first delay line from which a signal processing means can calculate the location of the primary electron on the plate means in a first direction; and (3) a second delay line means for using the plurality of secondary electrons to produce a pair of electrical pulses in a second delay line from which the signal processing means can calculate the location of the primary electron on the plate means in a second direction.

* * * * *